US010217648B1

(12) United States Patent
Brown et al.

(10) Patent No.: US 10,217,648 B1
(45) Date of Patent: Feb. 26, 2019

(54) FABRICATION OF MICROFLUIDIC CHANNELS IN DIAMOND

(71) Applicant: HRL Laboratories, LLC, Malibu, CA (US)

(72) Inventors: David F. Brown, Thousand Oaks, CA (US); Keisuke Shinohara, Thousand Oaks, CA (US); Miroslav Micovic, Thousand Oaks, CA (US); Alexandros Margomenos, San Jose, CA (US); Andrea Corrion, Oak Park, CA (US); Hector L. Bracamontes, Lawndale, CA (US); Ivan Alvarado-Rodriguez, Culver City, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/610,553

(22) Filed: May 31, 2017

(51) Int. Cl.
    *H01L 21/00* (2006.01)
    *H01L 21/48* (2006.01)
    *H01L 23/373* (2006.01)
    *H01L 23/46* (2006.01)

(52) U.S. Cl.
    CPC ........ *H01L 21/4803* (2013.01); *H01L 21/481* (2013.01); *H01L 23/3732* (2013.01); *H01L 23/46* (2013.01)

(58) Field of Classification Search
    CPC ... H01L 21/481; H01L 23/3732; H01L 23/46; H01L 21/4803
    See application file for complete search history.

(56) References Cited

U.S. PATENT DOCUMENTS

| | | | |
|---|---|---|---|
| 5,940,734 A | * | 8/1999 | Inoue ............... H01L 21/76819 257/E21.245 |
| 6,521,149 B1 | * | 2/2003 | Mearini .................. C23C 16/01 216/24 |
| 6,937,471 B1 | | 8/2005 | Haws et al. |
| 7,548,424 B2 | | 6/2009 | Altman et al. |
| 7,589,890 B2 | | 9/2009 | Betin et al. |
| 8,987,892 B2 | | 3/2015 | Davis et al. |
| 2003/0183368 A1 | | 10/2003 | Paradis et al. |
| 2008/0225485 A1 | | 9/2008 | Altman et al. |
| 2013/0074520 A1 | | 3/2013 | Wyatt et al. |

OTHER PUBLICATIONS

Bing Dang, et al., Wafer-Level Microfluidic Cooling Interconnects for GSI, IEEE, 2005, pp. 180-182.

(Continued)

*Primary Examiner* — Richard A Booth
(74) *Attorney, Agent, or Firm* — North Shore Associates

(57) ABSTRACT

Methods using chemical vapor deposition (CVD) of diamond deposited on a sacrificial material provide CVD diamond microchannel structures and 3-D interconnection structures of CVD diamond microfluidic channels. The sacrificial material is patterned to define locations and dimensions of the microchannels. The patterned sacrificial material is selectively removed from underneath the chemical vapor deposited (CVD) diamond to form the CVD diamond microchannels. The CVD diamond microchannels are integrated with electronic structures to provide an integral microfluidic cooling system to electronic devices.

20 Claims, 6 Drawing Sheets

(56) References Cited

OTHER PUBLICATIONS

Bing Dang, et al., Integrated Microfluidic Cooling and Interconnects for 2D and 3D Chips, IEEE Transactions on Advanced Packaging, Feb. 2010, pp. 79-87, vol. 33, No. 1.
Calvin R. King, et al., 3D Stacking of Chips with Electrical and Microfluidic I/O Interconnects, IEEE Electronic Components and Technology Conference, 2008, pp. 1-7.
Robert J. Nemanich, et al., CVD Diamond—Research, Applications and Challenges, MRS Bulletin, Jun. 2014, pp. 490-494, vol. 39.
David H. Altman, et al., Development of a Diamond Microfluidics-based Intra-Chip Cooling Technology for GAN, Proceedings of the ASME 2105 International Technical Conference and Exhibition on Packaging and Integration of Electronic and Photonic Microsystems, Jul. 6-9, 2015, pp. 1-7.
Charlotte Adams, Cool It! Heat Relief for RF Power Chips, Avionics Magazine, 2015, 5 pages.
Avram Bar-Cohen, et al., DARPA's Intra/Interchip Enhanced Cooling (ICECool) Program, CS Mantech Conference, May 13-16, 2013, pp. 171-174.
Avram Bar-Cohen, et al., Micro and Nano Technologies for Enhanced Thermal Management of Electronic components, Distribution Statement A-Viewgraphs, DARPA Micro/Nano Manufacturing Workshop—Michigan, May 22, 2013, 22 pages.
Goodson, Kenneth E., et al., Improved Heat Sinking for Laserdiode Arrays Using Microchannels in CVD Diamond, IEEE Transactions on Components, Packaging, and Manufacturing Technology, Part B, Advanced Packaging, Feb. 1997, pp. 104-109, vol. 20, Issue 1.

* cited by examiner

US 10,217,648 B1

FABRICATION OF MICROFLUIDIC CHANNELS IN DIAMOND

CROSS-REFERENCE TO RELATED APPLICATIONS

N/A

STATEMENT REGARDING FEDERALLY SPONSORED RESEARCH OR DEVELOPMENT

Background

1. Technical Field

The invention relates to chip-scale diamond microfluidic cooling structures for electronic devices. In particular, the invention relates to a fabrication technique to form diamond channels within a diamond film.

2. Description of Related Art

Dissipation of heat in electronic systems is an important component of electronic device durability, reliability and performance. Thermal limitations of various electronic devices have varying effects on operational capabilities in the field, some more profound than others, especially in military electronic systems. Thermal management of the electronic devices and the systems that employ them is essential to reliance on the capability of the electronic systems. However, some thermal management techniques may detrimentally affect device size, weight and power consumption (SWaP).

Various cooling systems have been designed to mitigate thermal limitations of electronic device and system operation, with various impacts to SWaP. Integration of some cooling systems can alleviate some of the thermal limitations. It may be advantageous if a cooling system could be integrated into a chip layout, a substrate structure, or a package design of the electronic devices and systems that have thermal management issues, and could do so without detrimental impact on SWaP or price, for example.

BRIEF SUMMARY

In some embodiments of the present invention, a method of forming a diamond microchannel structure is provided. The method of forming comprises patterning a base layer of sacrificial material on a substrate to define a location and dimensions of a microchannel. The method of forming further comprises depositing a layer of diamond using chemical vapor deposition (CVD) to cover the patterned base layer. The method of forming further comprises selectively removing the patterned sacrificial material from underneath the CVD deposited diamond layer to form a CVD diamond microchannel on the substrate.

In some embodiments of the present invention, a method of forming a three-dimensional (3-D) interconnect structure of diamond microfluidic channels is provided. The method of forming a 3-D interconnect structure comprises patterning a first layer of sacrificial material on a substrate to define locations and dimensions of first layer microchannels. The method of forming a 3-D interconnect structure further comprises depositing a first layer of diamond on the substrate using chemical vapor deposition (CVD) to cover the patterned first layer of sacrificial material. The first CVD diamond layer is then planarized to expose a surface of the patterned first layer of sacrificial material. The method of forming a 3-D interconnect structure further comprises patterning a second layer of the sacrificial material on the planarized first CVD diamond layer to define locations and dimensions of second layer microchannels. The patterned second sacrificial layer is in direct contact with the exposed surface of the patterned first layer of sacrificial material. The method of forming a 3-D interconnect structure further comprises depositing a second layer of diamond using chemical vapor deposition (CVD) to cover both the patterned second sacrificial layer and the planarized first CVD diamond layer. Then the patterned sacrificial material is selectively removed from underneath the deposited first and second CVD diamond layers to form a multilayer of interconnected diamond microchannels on the substrate.

In some embodiments of the present invention, a method of integrating a diamond microfluidic cooling system with an electronic structure is provided. The method of integrating comprises patterning a sacrificial material on a first side of a substrate to define an interconnecting pattern of microchannels. The method of integrating further comprises depositing a layer of diamond using chemical vapor deposition (CVD) to cover the patterned sacrificial material. The method of integrating further comprises selectively removing the patterned sacrificial material underneath the CVD deposited diamond layer to form CVD diamond microchannels on the first side of the substrate. The method of integrating further comprises integrating the CVD diamond microchannels with the electronic structure; and connecting conduits to an input end and an output end of the CVD diamond microchannels. The CVD diamond microchannels being configured to distribute a cooling fluid to dissipate heat from the electronic structure.

BRIEF DESCRIPTION OF THE DRAWINGS

Various features of embodiments in accordance with the principles described herein may be more readily understood with reference to the following detailed description taken in conjunction with the accompanying drawings, where like reference numerals designate like structural elements, and in which.

Figure 1A:
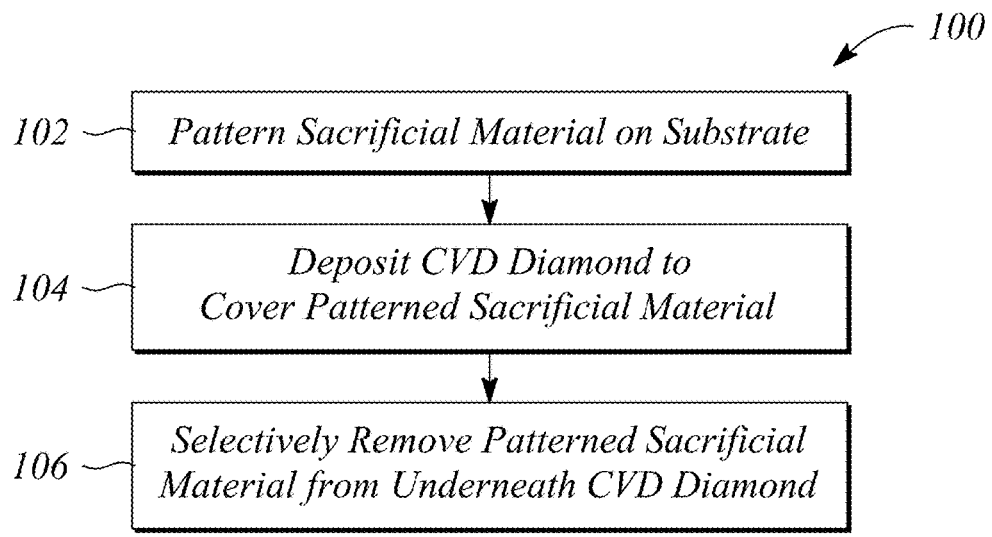
FIG. 1A illustrates a flow chart of a method of forming a diamond microchannel structure in an example, according to an embodiment consistent with the principles of the present invention.

Certain examples and embodiments have other features that are one of in addition to and in lieu of the features illustrated in the above-referenced figures. These and other features are detailed below with reference to the above-referenced figures.

DETAILED DESCRIPTION

Diamond has the highest know thermal conductivity of any solid at room temperature. However, diamond is also one of the hardest materials known and therefore, it is difficult to process diamond using conventional electronic device fabrication techniques. Embodiments of the present invention address these difficulties to provide a diamond structure compatible with conventional electronic device fabrication techniques that can be configured as an integral cooling structure to an electronic device. Embodiments consistent with the principles of the present invention provide a diamond channel structure using chemical vapor deposition (CVD) of diamond on a patterned sacrificial material that is removed from under the CVD diamond to form a diamond fluidic channel in micrometer-scale or nanometer-scale (herein collectively referred to as a 'microchannel' or 'microfluidic channel' for simplicity of discussion only). In particular, the fabrication of the diamond microchannel according to the principles described herein is compatible with the fabrication of high power electronic devices, such as radio frequency (RF) monolithic microwave integrated circuits (MMICs) including, but not limited to, gallium nitride (GaN) based power amplifiers or GaN-based high electron mobility transistors (HEMTs), for example. Many RF systems notoriously have operational thermal limitations set by a maximum junction temperature of the MMICs and other electronic devices. According to various embodiments, the diamond microchannel fabrication may be readily integrated with the fabrication of the electronic device itself to provide the electronic device with an integrated diamond microfluidic cooling structure. Among other things, integral evaporative cooling of high power electronic devices may improve one or both of performance and reliability of the high power electronic device.

In some embodiments, the diamond microchannel structure is a multilayer of diamond microchannels, and in particular, may be a three-dimensional (3-D) interconnect structure of the diamond microchannel multilayer. The 3-D interconnect structure of diamond microchannels may provide a multilayer microfluidic cooling structure to cool a 3-D stack of high power electronic devices. The multilayer microfluidic cooling structure may be integrated with the fabrication of the 3-D stack of high power electronic devices at wafer level, according to some embodiments. The cooling system provided by the integral CVD diamond microchannels according to the principles described herein may potentially improve output of a GaN-based power amplifier, for example, which is limited by self-heating. Such potential improvement in GaN-based power amplifier output may be by a factor of about 3 or more, for example.

As used herein, the article 'a' is intended to have its ordinary meaning in the patent arts, namely 'one or more'. For example, 'a microchannel' means one or more microchannels and as such, 'the microchannel' means 'the microchannel(s)' herein. Also, any reference herein to 'top', 'bottom', 'upper', 'lower', 'up', 'down', 'front', back', 'left', 'right', 'first' or 'second' is not intended to be a limitation herein. Herein, the term 'about' when applied to a value generally means within the tolerance range of the equipment used to produce the value, or may mean plus or minus 20%, or plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples and embodiments herein are intended to be illustrative only and are presented for discussion purposes and not by way of limitation.

Also herein, the term 'micrometer-scale' or 'micro-scale' generally refers to a dimension within a range of about 0.001 micrometer (μm) to about 1000 μm. The term 'nanometer-scale' or 'nano-scale' generally refers to a dimension that is within a range of about 0.1 nanometer (nm) to about 1 μm. The terms 'microchannel' and 'microfluidic' are used herein to refer to a structure having a dimension, e.g., a length, a width, or a height, that is within the micrometer-scale range or the nanometer-scale range.

The term 'chip-scale' refers to length and width dimensions on the order of those commonly used in microelectronic chips; generally understood to be within a range of about 100 μm to about 10 mm.

Also herein, the term 'inter-chip' refers to connections made between multiple chips; and the term 'intra-chip' refers to connections made within a single chip.

Figure 1B:
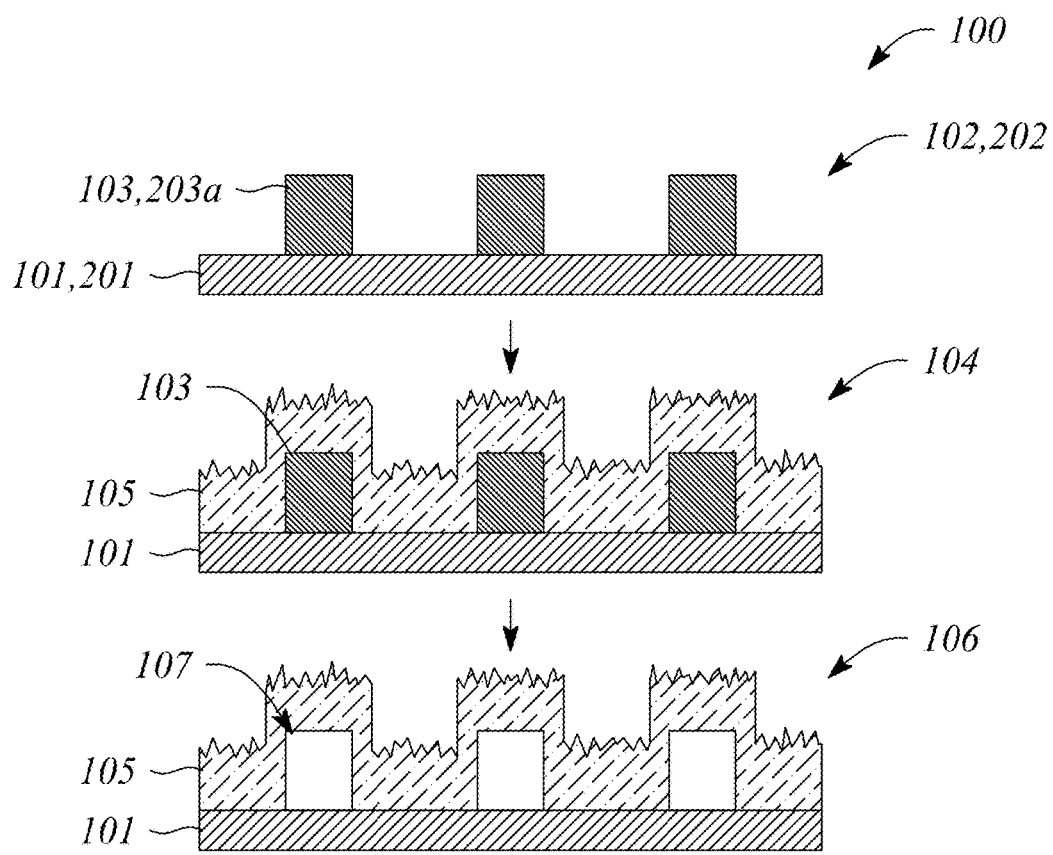
FIG. 1B illustrates cross sectional views of forming the diamond microchannel structure in a process flow of the method of FIG. 1A in an example, according to an embodiment consistent with the principles of the present invention.
Figure 1C:
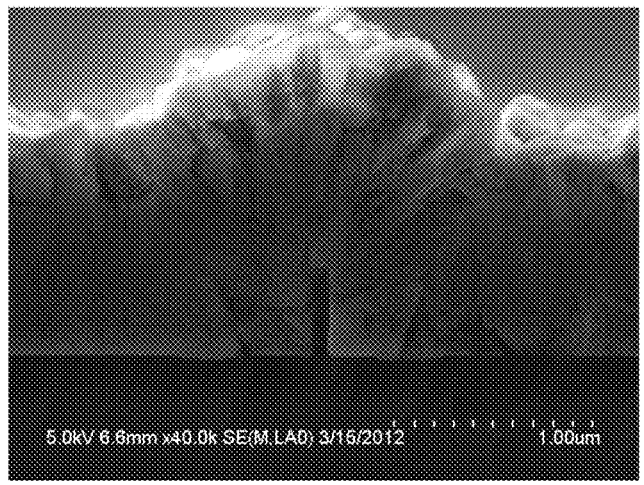
FIG. 1C illustrates a scanning electron micrograph (SEM) cross sectional view of a diamond microchannel formed by the method of FIG. 1A in an example, according to an embodiment consistent with the principles of the present invention.

According to some embodiments of the present invention, a method of forming a diamond microchannel structure is provided. FIG. 1A illustrates a flow chart of a method 100 of forming a diamond microchannel structure in an example, according to an embodiment consistent with the principles of the present invention. FIG. 1B illustrates cross sectional views of a process flow of the diamond microchannel structure formation using the method 100 in FIG. 1A in an example, according to an embodiment consistent with the principles of the present invention. FIG. 1C illustrates a scanning electron micrograph (SEM) cross sectional view of a diamond microchannel formed by the method 100 of FIG. 1A in an example, according to an embodiment consistent with the principles of the present invention The method 100 of forming comprises patterning 102 a base layer of a sacrificial material on a substrate to define a location and dimensions of a microchannel. The sacrificial material comprises a resist material that, after curing, is thermally stable at high temperature. Moreover, the sacrificial material is patternable in nano-scale or micro-scale dimensions using, for example, electron beam (e-beam) lithography or photolithography. In addition, the sacrificial material is selectively removable. By 'selectively removable' it is meant that the sacrificial material is removable without affecting other materials adjacent to the sacrificial material.

By 'high temperature' it is meant that the sacrificial material is thermally stable or relatively non-reactive in a range of about 600 degrees Celsius (° C.) to about 1000° C., for example. By 'thermally stable' it is meant that the sacrificial material is not chemically or physically degraded by and is relatively non-reactive to the high temperature. In some embodiments, the thermal stability temperature range is about 700° C. to about 1000° C., or about 600° C. to about 950° C., or about 600° C. to about 900° C., or about 600° C. to about 850° C. In some embodiments, the sacrificial material has a thermal stability sufficient to withstand deposition temperatures of diamond, as further described below.

In some embodiments, the sacrificial material is a high temperature resist material that may be either an inorganic material or an organic material. Moreover, the sacrificial material has a relatively low curing temperature e.g., relative to the high temperature ranges of thermal stability mentioned above. For example, the cure temperature of the sacrificial material is in a range of about 100° C. to about 400° C., or in other examples, a range of about 200° C. to 400° C., or a range of about 300° C. to about 400° C. Cure time may depend on a number of factors including, but not limited to, one or more of the sacrificial material used, the thickness of the sacrificial material, the cure temperature, the curing equipment used (e.g., oven or hot plate), the substrate material, and the surrounding environmental conditions (e.g., room temperature, room humidity, etc.). In some examples, the cure time may range from about 2 minutes to about 10 minutes, or about 2 minutes to about 8 minutes, or about 2 minutes to about 6 minutes, or about 2 minutes to about 4 minutes.

In some examples, the sacrificial material is a resist material selected from the group consisting of hydrogen silsesquioxanes (HSQ). A variety of HSQ has characteristics of thermal stability at deposition temperatures of diamond (i.e., chemical vapor deposition (CVD) of diamond), and of being patternable in the nano-scale range or the micro-scale range using direct e-beam exposure and using a chemical developer. Further, HSQ have a low cure temperature and may be selectively, chemically removed. For example, HSQ have a low cure temperature within the range of about 100° C. to about 400° C. and a cure time of about 3-5 minutes, for example on a hot plate. Moreover, HSQ can be selectively removed with a buffered oxide etch (BOE), e.g., a hydrofluoric acid (HF) based solution, which does not affect CVD-deposited diamond, for example. Useful resist materials may be either positive resist materials or negative resist materials.

The substrate used in forming a diamond microchannel structure includes, but is not limited to, a wafer, a semiconductor wafer, a semiconductor layer on a wafer, a semiconductor structure, or a semiconductor device. The term 'semiconductor', as used herein, has its common meaning, for example, as a material with semiconducting properties that may be inorganic or organic. Inorganic semiconductor materials include, but are not limited to, one or more elements (whether compound elements or pure elements) from Group IIB (or 12), Group IIIB (or 13), Group IVB (or 14), or Group VB (or 15), or Group VI (or 16) of the Periodic Table of the Elements, and include oxides and alloys. Some examples of inorganic semiconductor materials include, but are not limited to, Silicon (Si), Germanium (Ge), Silicon Carbide (SiC), Gallium Nitride (GaN), Gallium Arsenide (GaAs), or Indium Gallium Arsenide (InGaAs). Organic semiconductor materials include, but are not limited to, semiconducting polymers, rubene, pentacene, or tetracene, for example.

By 'semiconductor structure' it is meant a structure that includes a semiconductor. By 'semiconductor device' it is meant a device comprising a semiconductor that may further comprise electrodes. An 'electronic device' is a semiconductor device such as, but not limited to, an integrated circuit or a transistor. RF MMICs, GaN-based power amplifiers, and GaN-based HEMTs are examples of electronic devices that have high power output and associated heat dissipation issues that may benefit by having a cooling structure. The various embodiments of the present invention herein may provide an integral microfluidic cooling system to such electronic devices that may improve one or both of device performance and device reliability.

In some embodiments, patterning 102 a base layer of a sacrificial material on the substrate comprises applying the sacrificial material to the substrate in a relatively uniform layer. For example, the sacrificial material may be applied to a substrate, such as a wafer, using spin coating or another application method that provides a relatively uniform coating or layer over the surface of the substrate. Spin coating and other application methods that achieve an application thickness of the sacrificial material that is in a range of about 0.1 μm to about 10 μm may be used. In some examples, the application method may achieve a thickness of the sacrificial material in a range of about 0.5 μm to about 1.0 μm, or about 1.0 μm to about 2.0 μm, or about 2.0 μm to about 4.0 μm, or about 4.0 μm to about 10 μm.

In some embodiments, the sacrificial material is an inorganic polymer including, but not limited to, a flowable oxide dielectric material. For example, inorganic polymers, such as HSQ, or silicon-based flowable oxides, FOx®-1x and FOx®-2x, both trademarks of Dow Corning Corporation, Auburn, Mich., USA, are spin-on dielectrics may be used for the sacrificial materials. The flowable oxide products from Dow Corning, for example, each has a unique spin curve, i.e., unique spin speed versus thickness relationship.

In some embodiments, the substrate may be primed before application of the sacrificial material to promote substrate surface adhesion. For example, priming the substrate may include one or both of a dehydration bake and a chemical primer. In some examples, the substrate is primed by a dehydration bake, followed by application of a chemical primer including, but not limited to, an organosilicon compound (e.g., hexamethyldisilazane (HMDS)). The dehydration bake of the substrate may be in a temperature range of about 150° C. to about 250° C., or for example, may be about 175° C. to about 250° C., or about 175° C. to about 225° C., or about 175° C. to about 200° C. The dehydration bake may be for about 2 minutes to about 10 minutes, for example, or in other examples, be for about 2 minutes to about 8 minutes, or about 2 minutes to about 6 minutes, and may depend on the surrounding environment of the substrate.

In some embodiments, patterning 102 a base layer of a sacrificial material on the substrate further comprises using one of e-beam lithography and photolithography to define the microchannel location and the microchannel dimensions in the sacrificial material base layer. For example, as a negative resist material, the sacrificial material layer is exposed to e-beam lithography, such that exposed regions of the sacrificial material layer will remain, and unexposed regions of the sacrificial material layer will be removed during development. The location and dimensions of the exposed regions of sacrificial material remaining on the substrate define the microchannel location and microchannel dimensions. In an example, an HSQ negative resist material was patterned 102 with e-beam exposure conditions including, but not limited to, an acceleration voltage of about 100 kilovolts, a current of about 15 nanoAmperes, and a dose of about 1410 micro-coulombs per square centimeter (μC/cm²) to produce a pattern of microchannel locations on a substrate.

The developer used to develop the exposed sacrificial resist material layer may be a chemical solution which facilitates one or both of hardening the sacrificial material that is intended to remain and dissolving the sacrificial material that is intended to be removed. Example developer solutions useful to patterning 102 a base layer in accordance with the method 100 include, but are not limited to, tetramethylammonium hydroxide (TMAH)-based developers, xylene, toluene, methyl isobutyl ketone (MIBK), or methyl ethyl ketone (MEK). TMAH-based developers are compatible with HSQ resist materials. In the example above, the e-beam exposed HSQ resist material was developed for about 240 seconds with an about 10% solution of Microposit™ MF™312 Developer, a TMAH-based developer, wherein unexposed regions of the HSQ resist material was dissolved in the developer. Microposit™ MF™312 Developer is a product from Rohm and Haas Electronic Materials, and the trademarks are owned by Rohm and Haas Company, Philadelphia, Pa., USA.

Patterning 102 a base layer results in a base layer comprising a pattern of sacrificial material on the substrate to delineate a location and dimensions of a microchannel. FIG. 1B illustrates patterned sacrificial material 103 on a substrate 101, in an example of patterning 102 a base layer in accordance with the method 100 of forming a diamond microchannel structure. There are three microchannel locations illustrated by way of example and not as a limitation herein.

The method 100 of forming a diamond microchannel structure further comprises depositing 104 a layer of diamond using chemical vapor deposition (CVD) on the substrate to cover the patterned base layer of sacrificial material. The exposure and development of the patterned 102 base layer of sacrificial material renders the patterned sacrificial material thermally stable under conditions of CVD of diamond. In some embodiments, the layer of diamond that is chemical vapor deposited (CVD) is polycrystalline diamond; in other embodiments, the CVD diamond layer is nanocrystalline diamond. Herein, 'CVD diamond' means CVD-deposited diamond and includes unique characteristics of the diamond deposited using CVD. FIG. 1B further illustrates a CVD diamond layer 105 on the patterned sacrificial material 103 of on the substrate 101, in an example of depositing 104 a layer of diamond in accordance with the method 100 of forming a diamond microchannel structure.

Characteristics of a CVD diamond layer that may be considered for the purposes of the principles described herein include, but are not limited to, one or more of an amount of one or more of surface smoothness, thermal conductivity, corrosion resistance, optical transparency, low friction and wear resistance, and compatibility with subsequent manufacturing processes, for example. In an embodiment, depositing 104 a layer of diamond comprises using a high thermal conductivity CVD diamond, for example, UNCD® Aqua series CVD diamond, trademark of Advanced Diamond Technologies, Inc. (ADT) in Romeoville, Ill. In particular, a high thermal conductivity CVD diamond layer was deposited 104, for example at a temperature within a range of about 700° C. to about 900° C., on the above-described substrate comprising the patterned 102 base layer of sacrificial material 103, in accordance with the method 100 of forming a diamond microchannel structure. For example, a layer of UNCD® Aqua series 100 high thermal conductivity, polycrystalline CVD diamond from ADT has a large grain size greater than 1 micron to facilitate heat spreading and thermal management. Other suppliers of CVD diamond on substrates may be available. For example, SP3 Diamond Technologies, Santa Clara, Calif., USA, provides CVD diamond and coating services, including nanocrystalline diamond (NCD), micro-crystalline diamond (MCD) and low-stress NCD (LSNCD), that may be used in accordance with the principles described herein.

The method 100 of forming a diamond microchannel structure further comprises selectively removing 106 the patterned sacrificial layer from underneath the CVD diamond layer. The selective removal 106 of the patterned sacrificial layer comprises exposing the substrate to a chemical wet etch that selectively removes the sacrificial material. In some examples, the chemical wet etch comprises a buffered oxide etch (BOE), for example to remove HSQ. BOE is a hydrofluoric acid (HF)-based solution, which etches oxides but will not affect diamond or substrate materials including, but not limited to, silicon carbide, for example. In some embodiments, the substrate may be exposed to the BOE chemical wet etch, for example for about 10 minutes, to selectively dissolve the patterned sacrificial layer while leaving intact both the substrate and the CVD diamond layer. As a result, a microchannel is formed by the intact CVD diamond layer on the substrate, with the microchannel having the location and the dimensions of the selectively removed 106 patterned sacrificial layer. In some embodiments, a portion of the CVD diamond layer is removed to expose or to access a portion of the sacrificial material underneath before exposing the substrate to the chemical wet etch. In these embodiments, the selective removal 106 of the patterned sacrificial layer further comprises removing a portion of the CVD diamond layer to expose an underlying portion of sacrificial material. The CVD diamond layer portion may be removed using a dry etch technique, for example an oxygen-based ($O_2$-based) plasma dry etch. FIG. 1B further illustrates a microchannel 107 formed by the CVD diamond layer 105 on the substrate 101 in the locations and with the dimensions of the selectively removed 106 patterned sacrificial material 103, in an example of selectively removing 106 the patterned sacrificial layer in accordance with the method 100 of forming a diamond microchannel structure.

FIG. 1C illustrates in a scanning electron micrograph (SEM) a cross sectional view of a CVD diamond microchannel formed in accordance with an embodiment of the method 100 of forming a diamond microchannel structure. The SEM was taken at an acceleration voltage of 5.0 kV and has a magnification of 40.0 k SE(M, LA0)

In some embodiments (not illustrated), the method 100 of forming a CVD diamond microchannel structure may further comprise planarizing the surface of the deposited CVD diamond to achieve a substantially flat surface while maintaining the microchannels intact and covered. Moreover, the method 100 may further comprise depositing an epitaxial layer of a semiconductor material on the planarized surface of the CVD diamond. The semiconductor epitaxial layer may be used in a subsequent fabrication of an electronic structure or device directly on the CVD diamond microchannel structure. The electronic structure fabrication may use any of a variety of integrated circuit fabrication techniques, for example. In these embodiments, the CVD diamond microchannel structure is integrated with the electronic device to provide a directly adjacent (or e.g., a 'built-in') microfluidic cooling system for the fabricated electronic device.

Figure 2A:
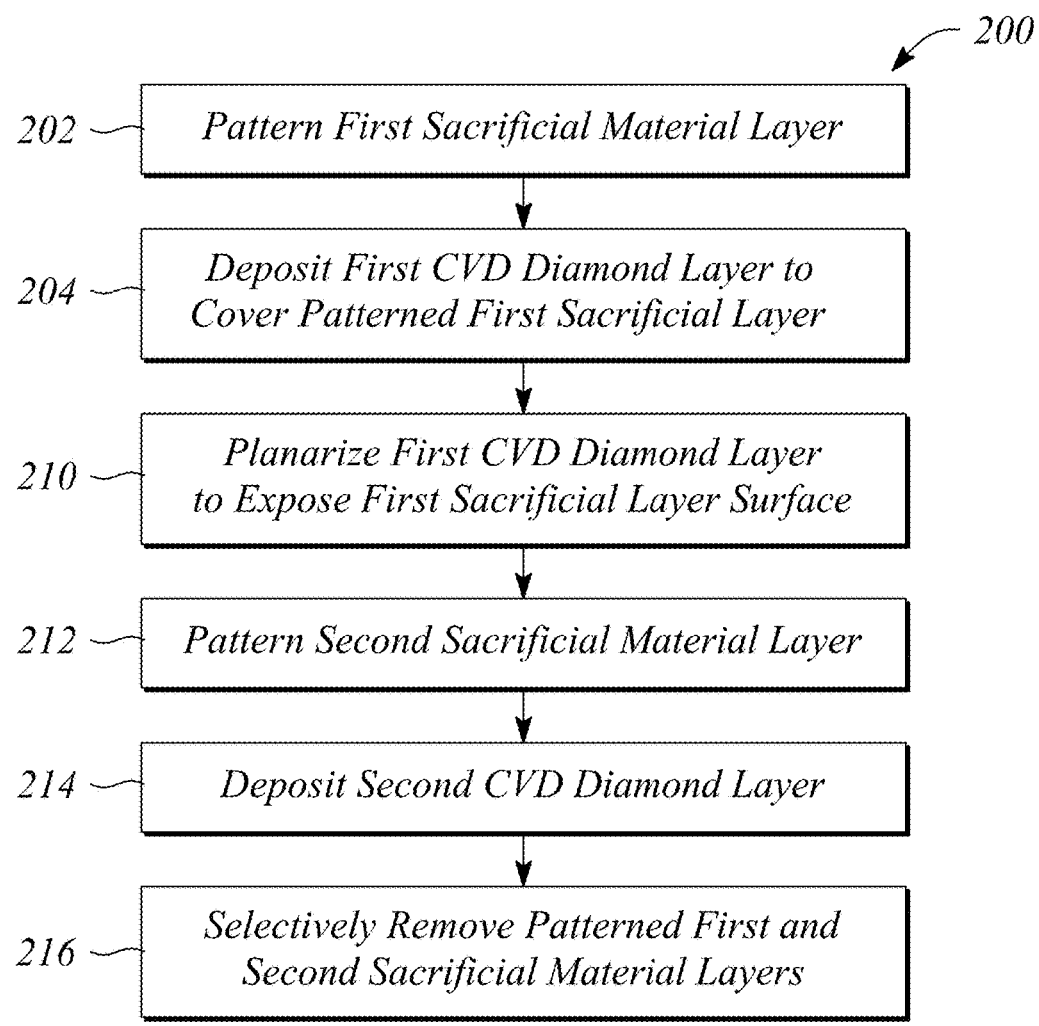
FIG. 2A illustrates a flow chart of a method of forming a three-dimensional (3-D) interconnect structure of diamond microfluidic channels in an example, according to an embodiment consistent with the principles of the present invention.
Figure 2B:
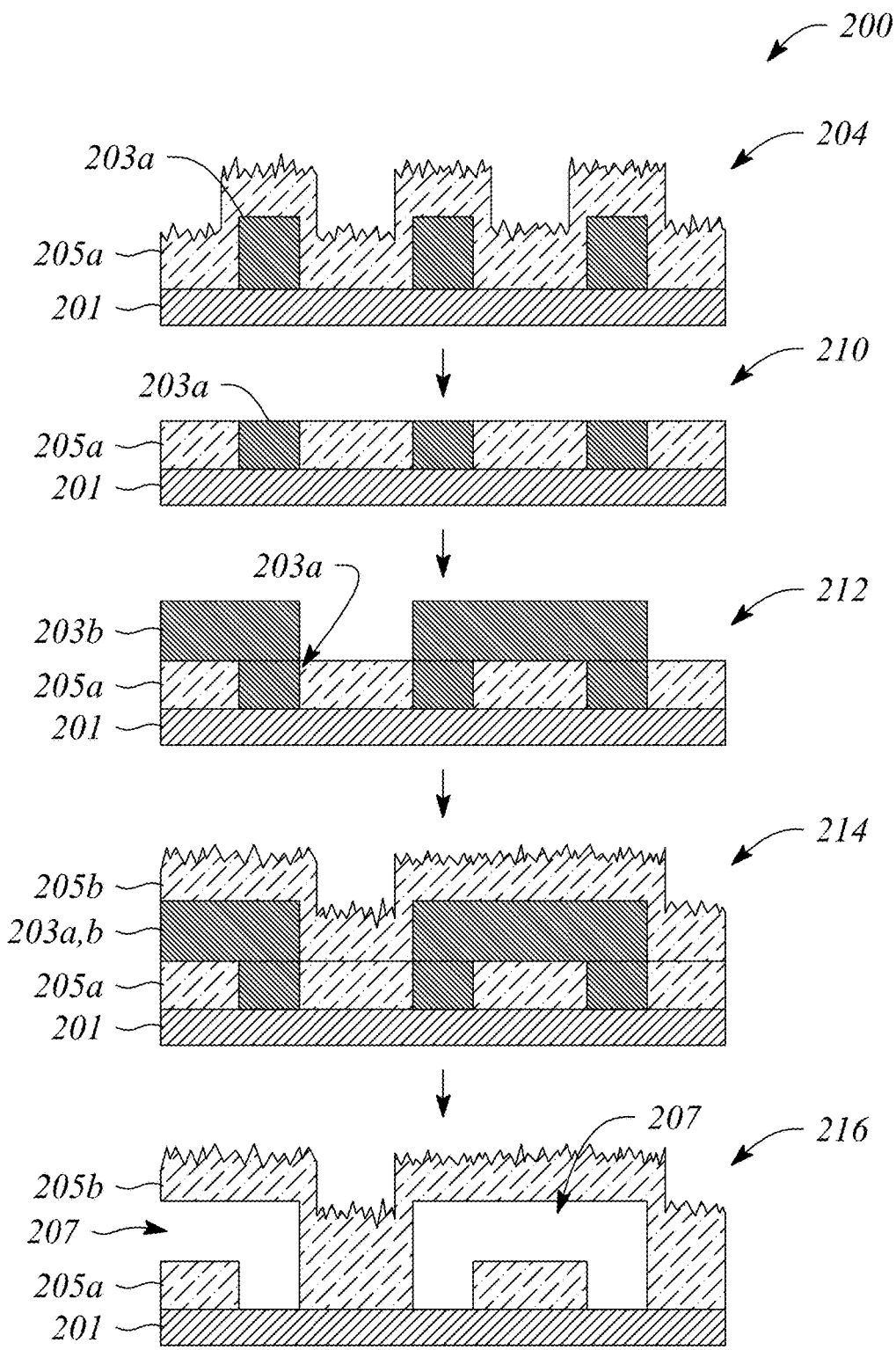
FIG. 2B illustrates cross sectional views of forming the 3-D interconnect structure of diamond microfluidic channels in a process flow of the method of FIG. 2A in an example, according to an embodiment consistent with the principles of the present invention.

According to some embodiments of the present invention, a method of forming a three-dimensional (3-D) interconnect structure of diamond microfluidic channels is provided. FIG. 2A illustrates a flow chart of a method 200 of forming a 3-D interconnect structure of diamond microfluidic channels in an example, according to an embodiment consistent with the principles of the present invention. FIG. 2B illustrates cross sectional views of a process flow of forming the 3-D interconnect structure of diamond microfluidic channels of the method of FIG. 2A in an example, according to an embodiment consistent with the principles of the present invention.

With reference to FIG. 2A, the method 200 of forming a 3-D interconnect structure of diamond microfluidic channels comprises patterning 202 a first layer of sacrificial material 203a on a substrate 201 to define locations and dimensions of a first layer of microchannels. FIG. 1B further illustrates the first sacrificial material layer patterning 202, for example. In some embodiments, the substrate 201, the patterned first sacrificial material layer 203a, and the patterning 202 may be substantially similar to the substrate 101, the patterned sacrificial material bas layer 103 and the patterning 102 thereof described above for the method 100 of forming a diamond microchannel structure. For example, a high temperature resist material, such as HSQ, may be deposited on a wafer substrate using spin coating, patterned using e-beam lithography, and developed using a TMAH-based solution, to provide the locations and dimensions of a first layer of microchannels.

Further with reference to FIGS. 2A and 2B, the method 200 of forming a 3-D interconnect structure of diamond microfluidic channels further comprises depositing 204 a first layer 205a of diamond on the substrate 201 using chemical vapor deposition (CVD) to cover the patterned first sacrificial material layer 203a. In some embodiments, the deposition 204 and the chemical vapor deposited (CVD) diamond 205a is substantially similar to the deposition 104 and the CVD diamond layer 105 described above for the method 100 of forming a diamond microchannel structure. For example, the CVD diamond material forms a blanket over the patterned 202 first sacrificial material layer 203a using CVD. Moreover, a blanket layer of UNCD® Aqua series 100 high thermal conductivity CVD diamond from Advanced Diamond Technologies, Inc. may be used, for example.

The method 200 of forming a 3-D interconnect structure of diamond microfluidic channels further comprises planarizing 210 the first CVD diamond layer 205a to a level or height that exposes a surface of the patterned 202 first sacrificial material 203a. In some embodiments, planarizing 210 the first CVD diamond layer 205a comprises polishing the CVD diamond layer with a diamond slurry. For example, a polishing bench may be used that includes, for example, a precision polishing jig from Logitech LTD, United Kingdom; a Lapmaster Pellon pad from Lapmaster International LLC, Mt. Prospect, Ill., USA; a DIATEC diamond slurry from Fujimi Corporation, OR, USA, e.g., about a 0.5 μm diamond slurry, and a weight placed on top of the jigs, e.g., a weight of about 17 pounds (lbs.). During planarizing 210, the first CVD diamond layer 205a may be polished using the polishing bench, for example, at about 100 rotations per minute (rpm) for about 6 hours to expose the surface of the patterned 202 first sacrificial material 203a according to the method 200 of forming a 3-D interconnect structure.

In some embodiments, planarizing 210 the first CVD diamond layer 205a comprises chemical mechanical polishing (CMP) of the diamond layer 205a. For example, a Strasbaugh chemical-mechanical polisher (CMP), e.g., from Axus Technology, Chandler, Ariz., USA, and abrasive pads having embedded diamond particles, such as Trizact™ abrasive pads from 3M Company, St. Paul, Minn., USA, may be used for planarizing 210 the first CVD diamond layer 205a. CMP process parameters may include, for example, a force about 3 pounds per square inch (psi) to about 12 psi; a speed of about 60 rpm to about 120 rpm; and a time of about 1 hour to about 2 hours, to expose the patterned first sacrificial layer 203a during planarizing 210, in accordance with the method 200 of forming a 3-D interconnect structure.

The method 200 of forming a 3-D interconnect structure of diamond microfluidic channels further comprises patterning 212 a second layer of the sacrificial material 203b on the planarized 210 first CVD diamond layer 205a to define locations and dimensions of second layer microchannels. The patterned second sacrificial material layer 203b is in contact with the exposed surface of the patterned first sacrificial material layer 203a. Patterning 212 the second sacrificial material layer 203b is substantially similar to the patterning 202 of the first layer of sacrificial material 203a described above, and in some embodiments, is substantially similar to the patterning 102 of the base layer of sacrificial material 103 described above for the method 100 of forming a diamond microchannel structure. For example, the high temperature resist material, such as HSQ, is deposited on the planarized surface having the exposed patterned first sacrificial material layer 203a, e.g., using spin coating. The deposited sacrificial material layer may be patterned using e-beam lithography, and developed using a TMAH-based solution, to provide the locations and dimensions of a second microchannel layer. The patterned second sacrificial material layer 203b interconnects with the exposed patterned first sacrificial material layer 203a in some locations on the substrate, and in some examples, the patterned second sacrificial material layer 203b directly interconnects or overlaps with some exposed locations of the patterned first sacrificial material layer 203a.

The method 200 of forming a 3-D interconnect structure of diamond microfluidic channels further comprises depositing 214 a second layer of diamond material 205b using chemical vapor deposition (CVD) to cover the surfaces of both the patterned 212 second sacrificial material layer 203b and the planarized 210 first CVD diamond layer 205a. The deposition 214 of the second CVD diamond material layer 205b to cover the surfaces may be substantially similar to the CVD process, as described above for depositing 204 the first diamond layer 205a. In some embodiments, the deposition 214 of the second CVD diamond layer 205b may be substantially similar to the CVD diamond deposition 104 described above for the method 100 of forming a diamond microchannel structure. For example, a layer of UNCD® Aqua series 100 high thermal conductivity CVD diamond, as described above, to cover the surfaces may be provided by Advanced Diamond Technologies, Inc.

The method 200 of forming a 3-D interconnect structure of diamond microfluidic channels further comprises selectively removing 216 the patterned sacrificial material 203a, 203b from underneath the deposited first and second CVD diamond layers 205a, 205b. In place of the selectively removed 216 patterned sacrificial material 203a, 203b is a multilayer of interconnected CVD diamond microchannels 207 on the substrate 201 that are configured to accommodate a cooling fluid in a 3-D interconnect structure of microfluidic channels. In some embodiments, the selective removal 216 of the patterned sacrificial material 203a, 203b may be substantially similar to the selective removal 106 of the patterned sacrificial layer 103 described above for the method 100 of forming a diamond microchannel structure. For example, a hydrofluoric acid-based solution (i.e., a buffered oxide etch (BOE)) will selectively remove an HSQ sacrificial material from the first and second patterned sacrificial layers 203*a*, 203*b* and leave intact the first and second CVD diamond layers 205*a*, 205*b*, as well as the substrate 201. The 3-D interconnect structure of microfluidic channels 207 remain in the locations and with the dimensions of the selectively removed 216 sacrificial materials 203*a*, 203*b*.

In some embodiments of the method 200 of forming a 3-D interconnect structure of microfluidic channels, additional layers of patterned sacrificial material and additional layers of CVD diamond may be added upon the above-described formed 3-D structure to form more complex multilayer microfluidic channel structures. In particular, the method 200 may include, before selectively removing 216 the patterned sacrificial material, additional sacrificial material patterning 212, CVD diamond deposition 214, and CVD diamond planarizing 210 procedures, as described above, to provide 3-D interconnect structures with additional microfluidic channel layers of interconnected CVD diamond microchannels that accommodate multilayer electronic devices, or to accommodate a 3-D assembly of stacked electronic devices or chips with cooling structures. For example, the 3-D interconnect structure of microfluidic channels may be compatibly fabricated directly on a particular electronic device to provide a custom 3-D microfluidic channel cooling structure using the method 200 of forming a 3-D interconnect structure of microfluidic channels described herein.

Figure 3:
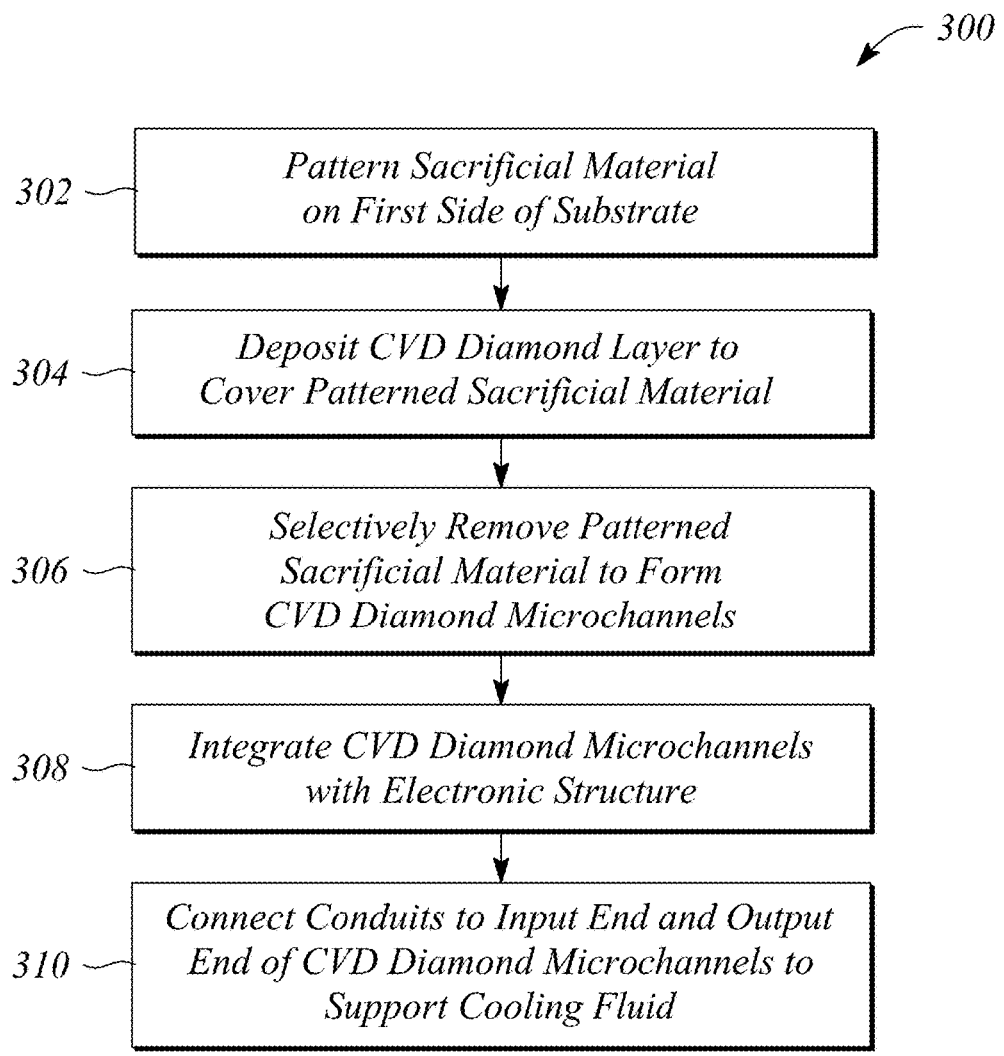
FIG. 3 illustrates a flow chart of a method of integrating a diamond microfluidic cooling system with an electronic structure in an example, according to an embodiment consistent with the principles of the present invention.

In some embodiments of the principles described herein, a method of integrating a diamond microfluidic cooling system with an electronic structure is provided. FIG. 3 illustrates a flow chart of a method 300 of integrating a diamond microfluidic cooling system with an electronic structure in an example, according to an embodiment consistent with the principles of the present invention. The method 300 of integration comprises patterning 302 a sacrificial material on a first side of a substrate. The pattern of sacrificial material has locations and dimensions to define a pattern of microchannels. In some examples, the pattern of sacrificial material may include some locations where the microchannels interconnect. In some embodiments, patterning 302 a sacrificial material comprises a sequential patterning 302 of multiple layers of sacrificial material separated by deposited CVD diamond layers, as described further below, to provide a multilayer microchannel structure. In some embodiments, the sacrificial material patterning 302 is substantially similar to the above descriptions of patterning 102, 202, 212 a sacrificial material in the methods 100, 200 that form diamond microchannels. For example, an HSQ resist material and e-beam lithography may be used.

The method 300 of integration further comprises depositing 304 diamond using chemical vapor deposition (CVD) to cover the first side of the substrate, including the patterned 302 sacrificial material. In some embodiments, depositing 304 diamond using CVD to cover the first side of the substrate comprises a sequential deposition 304 of multiple layers of CVD diamond separated by patterned sacrificial material layers, as described further below, to provide a multilayer microchannel structure. In some embodiments, the CVD diamond deposition 304 is substantially similar to the above descriptions of depositing 104, 204, 214 CVD diamond in the methods 100, 200 that form diamond microchannels. For example, UNCD® Aqua series 100 high thermal conductivity CVD diamond, as described above, provided by Advanced Diamond Technologies, Inc. (ADT) may be used.

The method 300 of integration further comprises selectively removing 306 the patterned sacrificial material from underneath the CVD diamond to form CVD diamond microchannels on the first side of the substrate. In some embodiments, the selective removal 306 of patterned sacrificial material includes selectively removing 306 the patterned sacrificial material from multiple patterned sacrificial layers, as described herein, to provide a multilayer microchannel structure. In some embodiments, the selective removal 306 of the sacrificial material is substantially similar to the above descriptions of selectively removing 106, 216 the sacrificial material in the methods 100, 200 that form diamond microchannels. For example, a buffered oxide etch (BOE) solution may be used to selectively remove HSQ resist sacrificial material by chemical wet etching without affecting the CVD diamond or the substrate.

In some embodiments of the method 300 of integration, the patterning 302 of a sacrificial material and the deposition 304 of CVD diamond on the first side of the substrate may be performed in several sequences of sacrificial material patterning 302 and CVD diamond deposition 304 on the first side of the substrate. Moreover, in these embodiments, the method 300 of integration further comprises planarizing the CVD diamond to expose a surface of a previously provided sacrificial material pattern before another layer of sacrificial material is patterned 302. The CVD diamond may be planarized using any of the planarization 210 procedures described above for the method 200 of forming a 3-D interconnect structure. As such, the method 300 of integrating a diamond microfluidic cooling system with an electronic structure includes herein single layer microchannel structures and various multilayer microchannel structures of CVD diamond, e.g., the 3-D interconnect structure described above. Moreover, the CVD diamond microchannel structures include one or both of interconnected microchannels within layers and microchannels interconnected between layers. Herein, the CVD diamond microchannel structures are also referred to as the 'CVD diamond microchannels' for simplicity of discussion.

The method 300 of integration further comprises integrating 308 the CVD diamond microchannels with an electronic structure to provide an electronic device with a diamond microfluidic cooling system. In some embodiments, integrating 308 the CVD diamond microchannels with the electronic structure comprises fabricating the electronic structure directly on a second side of the substrate opposite the CVD diamond microchannels on the first side. Since the CVD diamond microchannel structure according to the principles described herein has high temperature stability, chemical stability, hardness and durability due to the properties of diamond, electronic structure fabrication may include any of the common fabrication techniques used to fabricate electronic structures and devices. For example, any of the fabrication techniques used to fabricate HEMTs, MMICs, RF-MMICs, e.g., GaN-based power amplifiers may be used to fabricate the electronic structure on the CVD diamond microchannel substrate. For example, the substrate may comprise one or more of a semiconductor substrate, semiconductor wafer, and a semiconductor epitaxial layer, which is compatible with the electronic structure to be fabricated thereon.

In some embodiments, the substrate comprises a semiconductor epitaxial layer on the second side of the substrate opposite the first substrate side. In addition, the method 300 of integration further comprises, before patterning 302 the sacrificial material, forming a via through the substrate that terminates adjacent to the semiconductor epitaxial layer at the second substrate side. During patterning 302, the sacrificial material is patterned into the formed via on the first substrate side in order to locate a portion of the subsequent microchannel in alignment with the through-via. In these embodiments, integrating 308 the CVD diamond microchannels with the electronic structure comprises fabricating the electronic structure on the semiconductor epitaxial layer on the second side that is aligned with the CVD diamond microchannels including the via on the first side. In some examples, the CVD diamond microchannels in the substrate via are aligned with potential 'hot spots' of some electronic devices. For example, a GaN MIMIC wafer has GaN HEMTs that generate heat and represent potential wafer hot spots.

Figure 4:
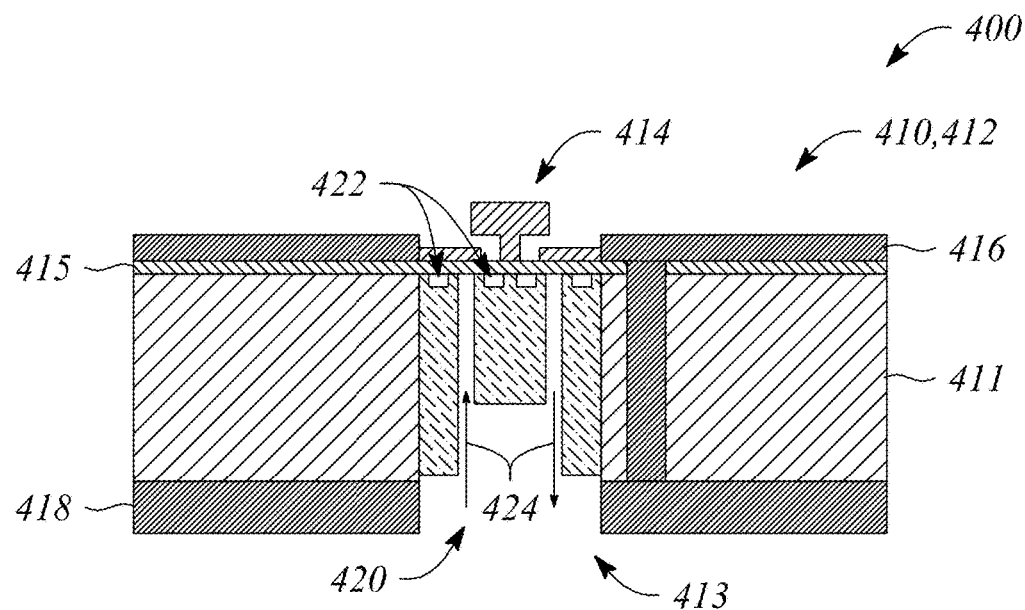
FIG. 4 illustrates a cross sectional view of an electronic device integrated with a CVD diamond microfluidic cooling system in an example, according to an embodiment consistent with the principles of the present invention.

FIG. 4 illustrates a cross sectional view of an electronic device integrated with a CVD diamond microfluidic cooling system in an example, in accordance with the principles described herein. In this example, the electronic device 410 is a portion of a GaN MIMIC wafer 412 having a GaN HEMT 414, a microstrip line 416 formed on a GaN epitaxial layer 415 on a first side of a wafer substrate 411, and having a ground plane 418 on a second side of the substrate 411. The substrate 411 further has a through-via 413 that extends from the second substrate side to directly below the GaN HEMT 414, terminating at the GaN epitaxial layer 415. In the through-via 413, the CVD diamond microfluidic cooling system 420 is located.

The CVD diamond microfluidic cooling system 420 comprises CVD diamond microchannels 422 directly adjacent to the GaN epitaxial layer 415 below the GaN HEMT 414. The CVD diamond microfluidic cooling system 420 further comprises input and output conduit paths 424 to provide a cooling fluid to the CVD diamond microchannels 422. The cooling fluid flows through the CVD diamond microchannels 422 to dissipate heat generated by the GaN HEMT 414 during operation (i.e., a potential 'hot spot' on the wafer substrate 411). The CVD diamond material of the microchannels characteristically has high thermal conductivity for a solid, and may have a highest thermal conductivity for a solid, at room temperature. Therefore, the CVD diamond microchannels 422 being located (i.e., during fabrication) adjacent to the heat-generating GaN HEMT 414 ('hot-spot') provides an integral cooling system that may have improved cooling performance. The integral CVD diamond cooling system, according to the principles described herein, may facilitate electronic device size reduction, weight reduction and power consumption reduction (SWaP). Further, the integral CVD diamond cooling system, according to the principles described herein, may improve performance of power amplifiers, e.g., GaN-based power amplifiers, which are prone to being performance limited by self-heating.

In some embodiments, a semiconductor epitaxial layer is located between the first side of the substrate and the CVD diamond microchannel structure on the first substrate side. In these embodiments, integrating 308 the CVD diamond microchannel structure with the electronic structure comprises attaching an exposed diamond surface of the CVD diamond microchannel structure to a surface of an electrical interconnect substrate. For example, the electrical interconnect substrate includes, but is not limited to, a single layer substrate or multilayer substrate, wherein the electrical interconnect substrate comprises one or both of electrical interconnects (conductive circuit traces to support operation of the electronic device) and vias or channels. The electrical interconnect substrate (or electrical interface routing) may be referred to as an 'interposer' that supports one or more electrical devices or structures assembled thereto. The exposed diamond surface of the CVD diamond microchannel structure is attached to the electrical interconnect substrate using a compatible bonding technique, for example wafer bonding. After attachment, integrating 308 the CVD diamond microchannels with the electronic structure further comprises removing the substrate from the CVD diamond microchannel structure on the first side to expose the semiconductor epitaxial layer that was located between the CVD diamond microchannels and the first substrate side, as described above.

Figure 5:
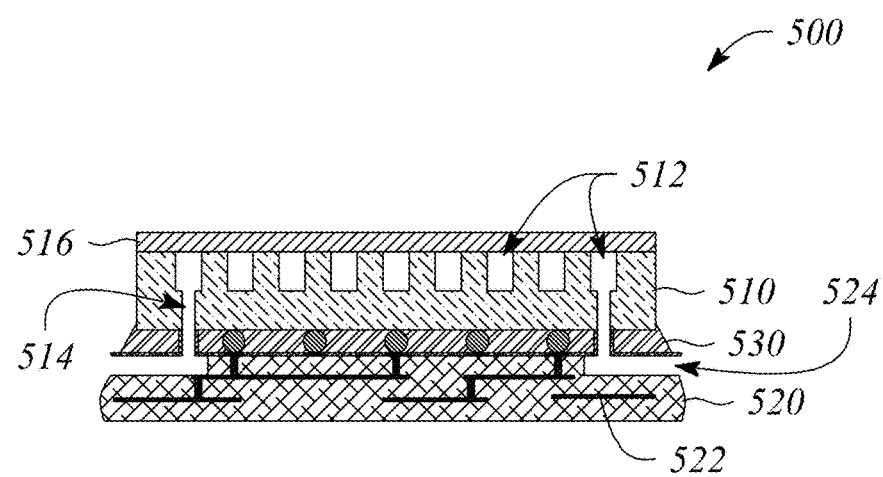
FIG. 5 illustrates a cross sectional view of a CVD diamond microfluidic cooling system in an example, according to an embodiment consistent with the principles of the present invention.

FIG. 5 illustrates a cross sectional view of a CVD diamond microfluidic cooling system in an example, in accordance with the principles described herein. The CVD diamond microfluidic cooling system 500 comprises a CVD diamond microchannel structure 510 and an electrical interconnect substrate 520. The CVD diamond microchannel structure 510 has a plurality of CVD diamond microchannels 512 and input and output ports 514. The CVD diamond microchannels 512 are covered on one side by a semiconductor layer 516, for example, a semiconductor epitaxial layer, as described above for the method 300 of integration. On an opposite side of the CVD diamond microchannel structure 510 is the electrical interconnect substrate 520. The electrical interconnect substrate 520 includes, for example, electrically conductive traces and interconnections 522 and is configured with vias or channels 524 aligned with the input and output microchannel ports 514 of the CVD diamond microchannel structure 510. In some examples, the CVD diamond microchannel structure 510 is bonded to the electrical interconnect substrate 520 using wafer bonding described above in the method 300 of integration. The attachment 530 between the CVD diamond microchannel structure 510 and the electrical interconnect substrate 520 may include one or both of solder and adhesive to bond the CVD diamond microchannel structure 510 to the electrical interconnect substrate 520. Further, micro-gaskets or microwashers dimensioned to and aligned with the microchannel ports 514 may be used in the wafer bonding and integration of the CVD diamond microchannel structure 510 and the electrical interconnect substrate 520. After wafer bonding, the substrate that supported the CVD diamond microchannel structure 510 is removed, for example by planarization or using a grinding method, depending on the material of the substrate. FIG. 5 illustrates the semiconductor epitaxial layer 516 exposed after the substrate removal.

In some embodiments, integrating 308 the CVD diamond microchannels with the electronic structure further comprises either attaching or forming the electronic structure on the semiconductor epitaxial layer exposed by removing the substrate after wafer bonding, for example. The electronic structures that can be formed or attached on the semiconductor epitaxial layer include electronic devices such as, but not limited to, heat-generating electronic devices, such as the HEMTs and GaN MMICs, as noted above. The electronic structure and the CVD diamond microchannel structure on opposite sides of the semiconductor epitaxial layer locates the structures substantially back-to-back to one another to provide an adjacent CVD diamond cooling system for heat-generating portions of the electronic devices. In some examples, attaching or forming the electronic structure on the exposed semiconductor epitaxial layer also includes providing electrical connections from the electronic structure to the electrical interconnect substrate ('interposer').

In other embodiments, integrating 308 the CVD diamond microchannels with the electronic structure comprises fabricating the electronic structure directly on or in the substrate adjacent to the CVD diamond microchannels. For example, the electronic structure may include any of a variety of integrated circuits (IC) and use any IC fabrication techniques to locate an electronic device or chip directly in or on a semiconductor wafer adjacent to the CVD diamond microchannels formed thereon. Further, a plurality of such substrates comprising integral electronic structure and CVD diamond microchannels can be bonded together in a stacked relationship, wherein commonly located microchannels in each substrate can be aligned with one another to form multilayer or stacked input and output channels for the multilayer cooling system of the 3-D stack of electronic structures. For example, solder interconnections between stacked electronic structures may be used.

Figure 6:
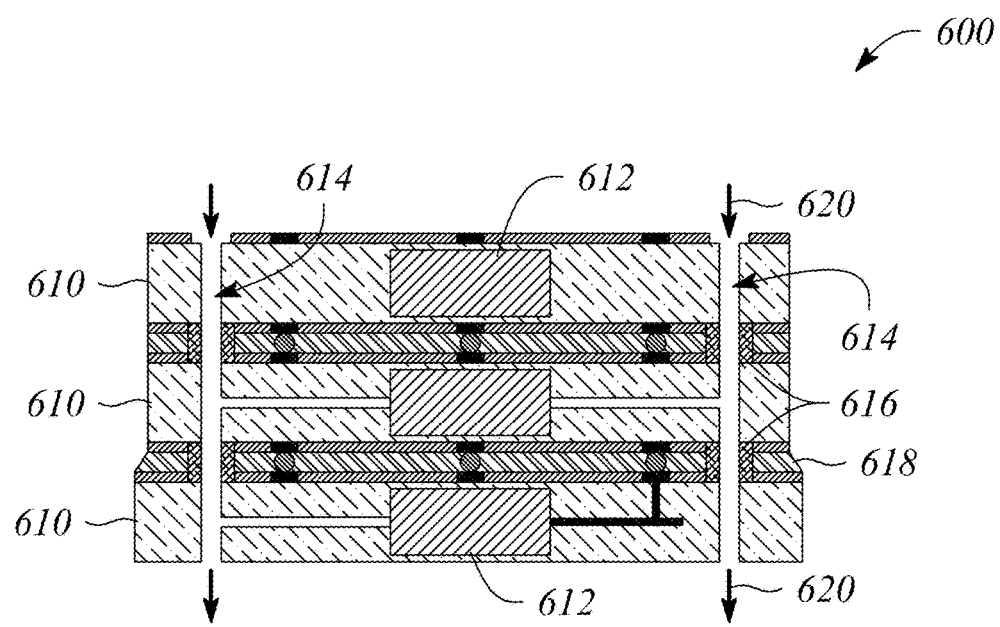
FIG. 6 illustrates a cross sectional view of an electronic structure having an integral 3-D CVD diamond microfluidic cooling system in an example, according to an embodiment consistent with the principles of the present invention.

FIG. 6 illustrates a cross sectional view of an electronic structure having an integral 3-D multilayer cooling system in an example in accordance with the principles described herein. The electronic structure 600 includes a plurality of CVD diamond substrates 610 in a 3-D stack. Each CVD diamond substrate 610 comprises an electronic device or IC die 612 and CVD diamond microchannels 614 adjacent to the IC die 612. The CVD diamond microchannels may be formed using any of the methods 100, 200 of forming CVD diamond microchannels, as described above. The CVD diamond microchannels 614 of each substrate 610 are aligned, for example vertically in a vertical stack of the 3-D stack of substrates 610. Interconnection 616 of the vertically aligned CVD diamond microchannels of the substrates 610 in the 3-D stack of the electronic structure 600 may include, but is not limited to, one or more of micro-washers, micro-gaskets, and micro-rings, that have dimensions tailored to the microchannel dimensions and tailored to a spacing or height between substrates 610 of the 3-D stack. Further, interconnection 618 of the substrates 610 in the 3-D stack of the electronic structure 600 may include, but is not limited to, one or more of solder and adhesives, which also provides electrical interconnection between substrates 610, and further, may include a sealant configured to seal the interconnections 616 of the CVD diamond microchannels 614 from fluid leakage. The electronic structure 600 further includes fluid ports 620 to flush a cooling fluid through the CVD diamond microchannels 614. Conduits (not illustrated) may be connected to the fluid ports 620 to introduce and to collect cooling fluid. The CVD diamond microfluidic cooling system may be integrated with the electronic structure using the method 300 of integration, as described above. As such, the cooling system integration 308 according to the method 300 of integration may also achieve inter-chip or intra-chip cooling solutions. For example, 'inter-chip' cooling having cooling channels placed between individual chips is illustrated in FIG. 6; and 'intra-chip' cooling having cooling channels placed within a chip is illustrated in FIGS. 4 and 5.

The method 300 of integrating a diamond microfluidic cooling system with an electronic structure further comprises connecting 310 to an input end and an output end of the CVD diamond microchannels. The conduits are configured to facilitate circulating a cooling fluid through the CVD diamond microchannels to dissipate heat from the formed electronic device during operation thereof. In particular, an input conduit receives a fluid and is configured to introduce the fluid to the CVD diamond microchannel structure; the CVD diamond microchannel structure is configured to distribute the fluid along a surface substantially adjacent to the electronic device; and an output conduit is configured to dispel or drain the fluid to provide a direct cooling system to the electronic device during device operation. Examples of fluids useful for cooling include, but are not limited to, water, propylene glycol-based aqueous solutions, or ethylene glycol-based aqueous solutions.

In some embodiments, the conduits may be made of any material that both can support a fluid and can be mated or attached to the CVD diamond microchannel input and output ends. For example, useful conduit materials include, but are not limited to, various types of plastic tubing, fluoropolymer tubing (e.g., polytetrafluoroethylene (PTFE)), polyether ether ketone (PEEK) tubing, or polyimide tubing. In addition, the attachment of the conduits to the CVD diamond microchannel input and output ends includes attachment procedures and materials such as, but not limited to, compatible connectors and fittings for the conduit-to-CVD diamond microchannel input and output interfaces. In an embodiment of a CVD diamond microchannel cooling system, a first CVD diamond microchannel of the CVD diamond microchannel structure (i.e., either single layer or multilayer) is configured with an input conduit to receive a cooling fluid and introduce the cooling fluid to the first CVD diamond microchannel. A second CVD diamond microchannel of the structure is configured to distribute the cooling fluid from the first CVD diamond microchannel to different portions of the microchannel structure (e.g., to different layers of the 3-D interconnect structure) adjacent to the electronic device. A third CVD diamond microchannel of the CVD diamond microchannel structure is configured with an output conduit to drain the cooling fluid from the different portions of the CVD diamond microchannel structure of the cooling system.

Examples of possible arrangements of single layer (e.g., wafer level) and multilayer or 3-D stacking of electronic devices that may be adapted to incorporate the integral CVD diamond microchannels and cooling systems of the methods 100, 200, 300 of the present invention, as described herein, may be found in Dang et al, "Integrated Microfluidic Cooling and Interconnects for 2D and 3D Chips", *IEEE Trans on Adv. Packaging*, vol. 33, no. 1, pp. 79-87 (2010); Dang et al, "Wafer-level microfluidic cooling interconnects for GSI", *IEEE International Interconnect Technology Conference*, pp. 180-182 (2005); and King et al, "3D Stacking of Chips with Electrical and Microfluidic I/O Interconnects", 2008 *Electronic Components and Technology Conference*. These references are incorporated by reference herein. These references also provide some examples of materials and processes for device fabrication, assembly, and interconnection, as well as for input/output conduit connections, that may be adapted with the CVD diamond structures and cooling systems described above with respect to the methods 100, 200 and 300 of the present invention herein.

Thus, there have been described examples of methods of manufacturing CVD diamond microchannels and of integrating the CVD diamond microchannels with electronic structures. It should be understood that the above-described embodiments and examples are merely illustrative of some of the many specific examples and embodiments that represent the principles consistent with the principles described herein. Clearly, those skilled in the art can readily devise numerous other arrangements without departing from the scope consistent with the principles described herein as defined by the following claims.

What is claimed is:

1. A method of forming a diamond microchannel structure, the method comprising:

patterning a base layer of sacrificial material on a substrate to define a location and dimensions of a microchannel;

depositing a layer of diamond using chemical vapor deposition (CVD) to cover the patterned base layer; and selectively removing the patterned sacrificial material from underneath the CVD deposited diamond layer to form a CVD diamond microchannel on the substrate.

2. The method of forming a diamond microchannel structure of claim 1, wherein the sacrificial material is an inorganic material that can withstand CVD temperatures of diamond.

3. The method of forming a diamond microchannel structure of claim 1, wherein the sacrificial material is a material selected from the group consisting of hydrogen silsesquioxanes (HSQ).

4. The method of forming a diamond microchannel structure of claim 1, wherein patterning a base layer of sacrificial material on a substrate comprises defining the microchannel location and the microchannel dimensions with the sacrificial material using one of electron beam lithography and photolithography.

5. The method of forming a diamond microchannel structure of claim 1, wherein selectively removing the sacrificial material comprises selectively etching the sacrificial material from underneath the CVD diamond layer.

6. The method of forming a diamond microchannel structure of claim 5, wherein selectively etching comprises using a wet chemical etchant comprising hydrofluoric acid to remove the sacrificial material without affecting the substrate or CVD diamond layer, and wherein the substrate is one of a semiconductor wafer and a semiconductor device, the CVD diamond microchannel being formed directly on the semiconductor wafer or the semiconductor device.

7. The method of forming a diamond microchannel structure of claim 1, further comprising:
integrating the CVD diamond microchannel with an electronic device; and
attaching conduits to an input end and an output end of the CVD diamond microchannel structure, an input conduit being configured to introduce a fluid to the CVD diamond microchannel, the CVD diamond microchannel structure being configured to distribute the fluid along a surface adjacent to the electronic device, and an output conduit being configured to dispel the fluid.

8. The method of forming a diamond microchannel structure of claim 7, wherein integrating the CVD diamond microchannel with an electronic device comprises wafer bonding the CVD diamond microchannel to the electronic device.

9. The method of forming a diamond microchannel structure of claim 7, wherein integrating the CVD diamond microchannel with an electronic device comprises:
planarizing a surface of the CVD diamond layer while leaving the CVD diamond microchannel intact; and
fabricating an electronic device directly on the planarized surface of the CVD diamond layer.

10. The method of forming a diamond microchannel structure of claim 1, further comprising before selectively removing the sacrificial material:
planarizing the CVD diamond layer to expose a surface of the patterned base layer of sacrificial material;
patterning another layer of sacrificial material on the planarized CVD diamond layer to define a location and dimensions of another microchannel, the patterned other layer of sacrificial material being in direct contact with the exposed surface of the patterned base layer of sacrificial material; and
depositing another layer of diamond using chemical vapor deposition on both the patterned other sacrificial layer and the planarized CVD diamond layer,
wherein removing the sacrificial material further comprises removing the patterned other sacrificial layer, the CVD diamond microchannel structure being a multilayer of CVD diamond microchannels.

11. The method of forming a diamond microchannel structure of claim 10, further comprising repeating planarizing the CVD diamond layer, patterning another layer of sacrificial material on the planarized CVD diamond layer, and depositing another CVD diamond layer to form a three-dimensional (3-D) interconnect structure of multilayer CVD diamond microchannels on the substrate.

12. The method of forming a diamond microchannel structure of claim 11, further comprising:
integrating the 3-D interconnect structure of multilayer CVD diamond microchannels with an electronic device; and
attaching conduits to an input end and an output end of the 3-D interconnect structure, a first CVD diamond microchannel of the multilayer being configured with an input conduit to introduce a cooling fluid to the first CVD diamond microchannel, a second CVD diamond microchannel of the multilayer being configured to distribute the cooling fluid from the first CVD diamond microchannel to different layers of the 3-D interconnect structure adjacent to the electronic device, and a third CVD diamond microchannel of the multilayer being configured with an output conduit to drain the cooling fluid from the different layers of the 3-D interconnect structure.

13. A method of forming a three-dimensional (3-D) interconnect structure of diamond microfluidic channels, the method comprising:
patterning a first layer of sacrificial material on a substrate to define locations and dimensions of first layer microchannels;
depositing a first layer of diamond on the substrate using chemical vapor deposition (CVD) to cover the patterned first layer of sacrificial material;
planarizing the first CVD diamond layer to expose a surface of the patterned first layer of sacrificial material;
patterning a second layer of the sacrificial material on the planarized first CVD diamond layer to define locations and dimensions of second layer microchannels, the patterned second sacrificial layer being in direct contact with the exposed surface of the patterned first layer of sacrificial material;
depositing a second layer of diamond using chemical vapor deposition to cover both the patterned second sacrificial layer and the planarized first CVD diamond layer; and
selectively removing the patterned sacrificial material from underneath the deposited first and second CVD diamond layers to form a multilayer of interconnected CVD diamond microchannels on the substrate.

14. The method of forming a three-dimensional (3-D) interconnect structure of diamond microfluidic channels of claim 13, wherein before removing the patterned sacrificial material the method further comprises repeating each of planarizing the CVD diamond layer, patterning a subsequent sacrificial material layer on the planarized CVD diamond layer, and depositing a subsequent CVD diamond layer on the subsequent patterned sacrificial material layer to increase a number of CVD diamond microchannel layers of the multilayer.

15. The method of forming a three-dimensional (3-D) interconnect structure of diamond microfluidic channels of claim 13, wherein the substrate is one of a semiconductor wafer and a gallium nitride-based semiconductor device, the multilayer of interconnected CVD diamond microchannels being formed directly on the semiconductor wafer or the gallium nitride-based semiconductor device.

16. A method of integrating a diamond microfluidic cooling system with an electronic structure, the method comprising:
    patterning a sacrificial material on a first side of a substrate to define an interconnecting pattern of microchannels;
    depositing a layer of diamond using chemical vapor deposition (CVD) to cover the patterned sacrificial material;
    selectively removing the patterned sacrificial material underneath the CVD diamond layer to form CVD diamond microchannels on the first side of the substrate;
    integrating the CVD diamond microchannels with the electronic structure; and
    connecting conduits to an input end and an output end of the CVD diamond microchannels, the CVD diamond microchannels being configured to distribute a cooling fluid to dissipate heat from the electronic structure.

17. The method of integrating a diamond microfluidic cooling system with an electronic structure of claim 16, wherein the substrate is a semiconductor structure, and wherein integrating the CVD diamond microchannels with the electronic structure comprises fabricating the electronic structure on a second side of the semiconductor structure opposite the CVD diamond microchannels on the first side.

18. The method of integrating a diamond microfluidic cooling system with an electronic structure of claim 17, wherein the semiconductor structure comprises a semiconductor epitaxial layer, and wherein the electronic structure on the second side of the semiconductor structure is a radio frequency monolithic microwave integrated circuit (RF MMIC).

19. The method of integrating a diamond microfluidic cooling system with an electronic structure of claim 16, wherein the substrate comprises a semiconductor epitaxial layer on a second side of the substrate opposite the first substrate side, the method further comprising:
    forming a via through the substrate that terminates adjacent to the semiconductor epitaxial layer at the second substrate side, the sacrificial material being patterned in the formed via on the first substrate side,
    wherein integrating the CVD diamond microchannels with the electronic structure comprises fabricating the electronic structure on the semiconductor epitaxial layer on the second side aligned with the CVD diamond microchannels in the via on the first side.

20. The method of integrating a diamond microfluidic cooling system with an electronic structure of claim 16, wherein a semiconductor epitaxial layer is between the first substrate side and the CVD diamond microchannels, and wherein integrating the CVD diamond microchannels with the electronic structure comprises:
    attaching the CVD diamond microchannels to a surface of an electrical interconnect substrate;
    removing the substrate from the attached CVD diamond microchannels to expose the semiconductor epitaxial layer; and
    forming the electronic structure on the exposed semiconductor epitaxial layer, the electronic structure having electrical connections to the electrical interconnect substrate.

* * * * *